United States Patent [19]
Byers

[11] 3,947,736
[45] Mar. 30, 1976

[54] WAVEFORM SYNTHESIS USING SWITCHING CIRCUITS

[75] Inventor: David John Byers, Christchurch, New Zealand

[73] Assignee: New Zealand Inventions Development Authority, Wellington, New Zealand

[22] Filed: Sept. 3, 1974

[21] Appl. No.: 502,270

[30] Foreign Application Priority Data
Sept. 3, 1973 New Zealand.................. 171872
July 10, 1974 New Zealand.................. 174825

[52] U.S. Cl. ............... 318/227; 318/230; 318/231; 321/9 A
[51] Int. Cl.² ...................................... H02K 17/02
[58] Field of Search ........ 321/5, 9 A; 318/227, 230, 318/231

[56] References Cited
UNITED STATES PATENTS
3,409,817  11/1968  Gillett ................................ 321/9 A
3,423,662  1/1969   Schlabach et al ................... 321/9 A
3,538,420  11/1970  Klein .................................. 321/9 A
3,662,247  5/1972   Schieman ........................... 321/9 A
3,739,253  6/1973   Humphrey et al. ................. 321/9 A FOREIGN PATENTS OR APPLICATIONS
293,200   6/1969   Australia ............................ 321/9 A Primary Examiner—William M. Shoop
Attorney, Agent, or Firm—Sughrue, Rothwell, Mion & Zinn

[57] ABSTRACT

The synthesising of a waveform which upon integration will approximate a sinusoid of controllable frequency and amplitude is disclosed. Any desired amplitude may be programmed for a particular frequency. The synthesiser is suitable as a variable speed AC motor drive. The output waveform is synthesised by chopping a square wave using a variable width chop. To obtain lower harmonic content, a chopped square wave is Walsh multiplied with another square wave of different frequency to produce a pulse width modulated waveform having a frequency equal to the frequency difference between the square waves. Methods for accurately controlling the difference frequency using variable digital dividers are disclosed.

68 Claims, 10 Drawing Figures

WAVEFORM SYNTHESIS USING SWITCHING CIRCUITS

BACKGROUND OF THE INVENTION

This invention relates to electrical waveform synthesis using switching circuits and in particular but not solely switching circuit waveform synthesisers for use as AC motor drives.

An alternating current waveform can be derived or synthesised from a direct current by appropriately switching the DC source. Equipment for producing an AC waveform from a DC source are known as inverters. These inverters may be either static or non-static. Static inverters are much preferred and may be formed using suitable solid state devices such as thyristors or triacs. Whether the inverter be static or non-static the output is a complex waveform, whereas it is frequently desirable that the output be sinusoidal. Sinusoidal waveforms can be produced be suppressing unwanted harmonics contained in the switching circuit output waveform. For example, a low pass or integrating filter can be used to pass only the lower frequency or fundamental waveform which is generally a sinusoid. In some instances the electric circuit or load into which the waveform is injected acts as its own integrating filter. Such is the case with the AC electric motor. Such a motor can be driven from a simple inverter producing a square wave output. If, as would be expected to be the case, the motor was 3-phase then by the use of a 3-phase inverter the line voltage will have reduced low order harmonics even though the phase voltages are square waves. However, it is desirable to drive such motors by an AC waveform more closely approximating a sinusoid.

To allow for complete control over the inverter output waveform characteristics it is usual to use an external pulse source to switch the inverter. The inverter switching pulses are produced by low power circuitry and the output from this circuitry (which would normally be a unidirectional voltage waveform) is used to switch a static inverter per se which in turn switches the power to the load (as a bi-directional voltage waveform). The pulse source circuitry may be conveniently formed using integrated circuits. It is relatively easy using such techniques to synthesise a complex waveform having a variable fundamental frequency which may then be used to appropriately switch an inverter. This feature is particularly significant since the availability of high power variable frequency AC means that AC motors can be used in variable speed applications. In most situations the mains supply is AC and, accordingly, variable speed AC motor drives must normally include associated rectifier and smoothing equipment to produce the inverter input DC. This equipment is however already required for DC motor drives which at present predominate. A variable speed application where the use of an AC motor would be particularly attractive, and incidently where the mains supply is DC, is as a power source for vehicles.

A requirement of an AC motor is that if it is desired to vary motor speed by varying the supply frequency, the supply voltage should also be varied proportionally to ensure a constant voltage-time product and thus constant flux. A known method for satisfying this requirement is to vary the voltage of the inverter DC supply by the use of a chopper. For reasons of simplicity and economics it would be desirable to control the inverter output amplitude by appropriately controlling the low power switching pulses.

A known technique for synthesising a low frequency sinusoid using two state switching circuits is to generate a pulse width modulated waveform, the width of the pulses being related to the amplitude of the desired sinusoid at any instant. This pulse width modulated waveform is then passed through an integrating filter designed to pass only the desired sinusoid. A common method of obtaining the necessary pulse width modulated waveform is to compare a reference sinusoid with a high frequency carrier having a trianglular or sawtoothed waveform. This method requires complex linear and digital circuitry, particularly for 3-phase systems which require both phase balance and voltage amplitude control over wide frequency and amplitude ranges. It would be desirable for such a synthesiser to utilise purely digital circuitry especially as the derivation of a 3-phase sinusoidal signal is thereby simplified.

SUMMARY OF THE INVENTION

It is therefore an object of the present invention to provide a method and apparatus to go at least some way towards satisfying the abovementioned *desiderata*.

It is a further object of the present invention to provide a method and apparatus fo synthesising a complex waveform which upon integration will approximate a sinusoid the frequency and amplitude of which can be varied.

Accordingly, in one aspect the invention consists of a method for synthesising a waveform which upon integration will approximate a sinusoid of controllable amplitude and frequency. This is accomplished by generating at least one base square wave having the selected frequency and chopping this square wave once each half cycle with a chopping pulse. The chopping pulse width is set according to the desired amplitude of the sinusoid.

In a further aspect the invention consists in a waveform synthesiser for producing a waveform which upon integration will approximate a sinusoid of controllable amplitude and frequency. The synthesiser includes a square wave generator producing at least one base square wave and a variable width chopping pulse generator. Logic circuitry associated with the square wave generator sets the chopping pulse location relative to each half cycle of each square wave. Means are provided for mixing or gating each square wave with the chopping pulse to produce as an output a chopped square wave. The fundamental component of the integral of this output has an amplitude which is a function of the chopping pulse width.

Preferred forms of the invention include the following features:

1. a three-phase output waveform,
2. a high power static inverter output stage,
3. a second control square wave which is Walsh multiplied with the chopped base square wave to produce a pulse width modulated output waveform which contains lower hamonics and has a fundamental frequency equal to the difference between the fundamental frequencies of the base and control square waves, and
4. a tri-state static inverter output stage with appropriate switching circuits which reduces the demand on the switching capabilities of the static inverter power switches.

The invention is particularly useful as a variable frequency AC motor drive.

BRIEF DESCRIPTION OF THE DRAWINGS

The preferred forms of the present invention will now be described with reference to the accompanying drawings in which.

DETAILED DESCRIPTION OF THE PREFERRED EMBODIMENTS

In the first embodiment of the invention three-phase square waves are generated using a twisted ring counter from which three-phase square waves of exact phase balance may be obtained whatever the frequency at which they are generated. These square waves when integrated will approximate a sinusoid. Amplitude control of the resulting sinusoid is obtained by chopping the square waves from one amplitude state to the other twice during each wave period. The frequency of the sinusoid is varied by varying the frequency of the clock pulse generator feeding the counter.

If the wave period T is measured from the instant of transition from the lower to higher level, at least a portion of the first chopping pulse must be within the range T/6 to T/3 and at least a portion of the second chopping pulse must be within the range 2T/3 to 5T/6, such that the area of each segment in the resultant wave is dependent on the width of the chopping pulse.

Preferably, the maximum width of each chopping pulse is T/6, and if the chops lie entirely within the stated ranges, the mean line voltages will then decrease from a maximum to zero as the width of the chop increases from zero to its maximum value.

Figure 1:
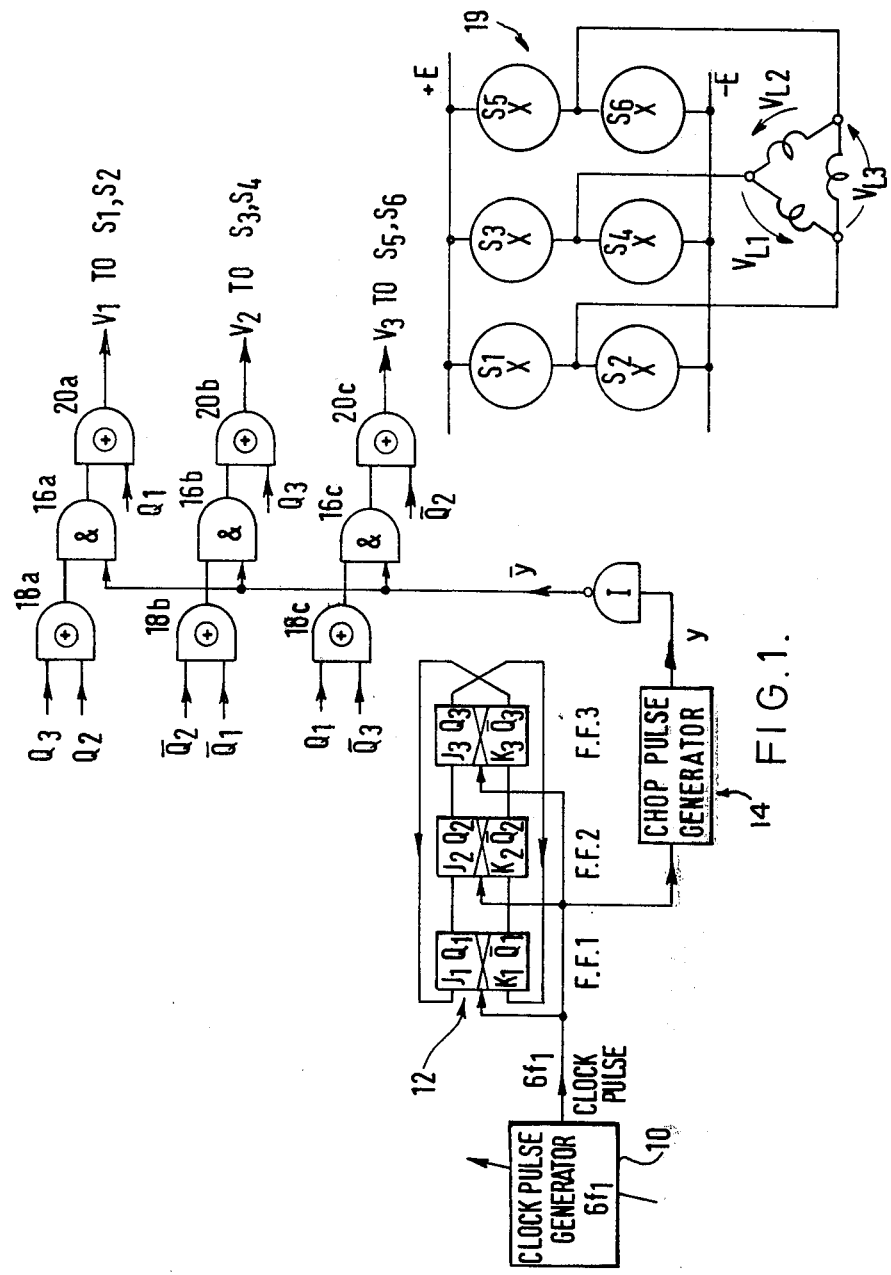
FIG. 1 is a block diagram of one form of waveform synthesiser in use as a three-phase AC motor drive.
Figure 2:
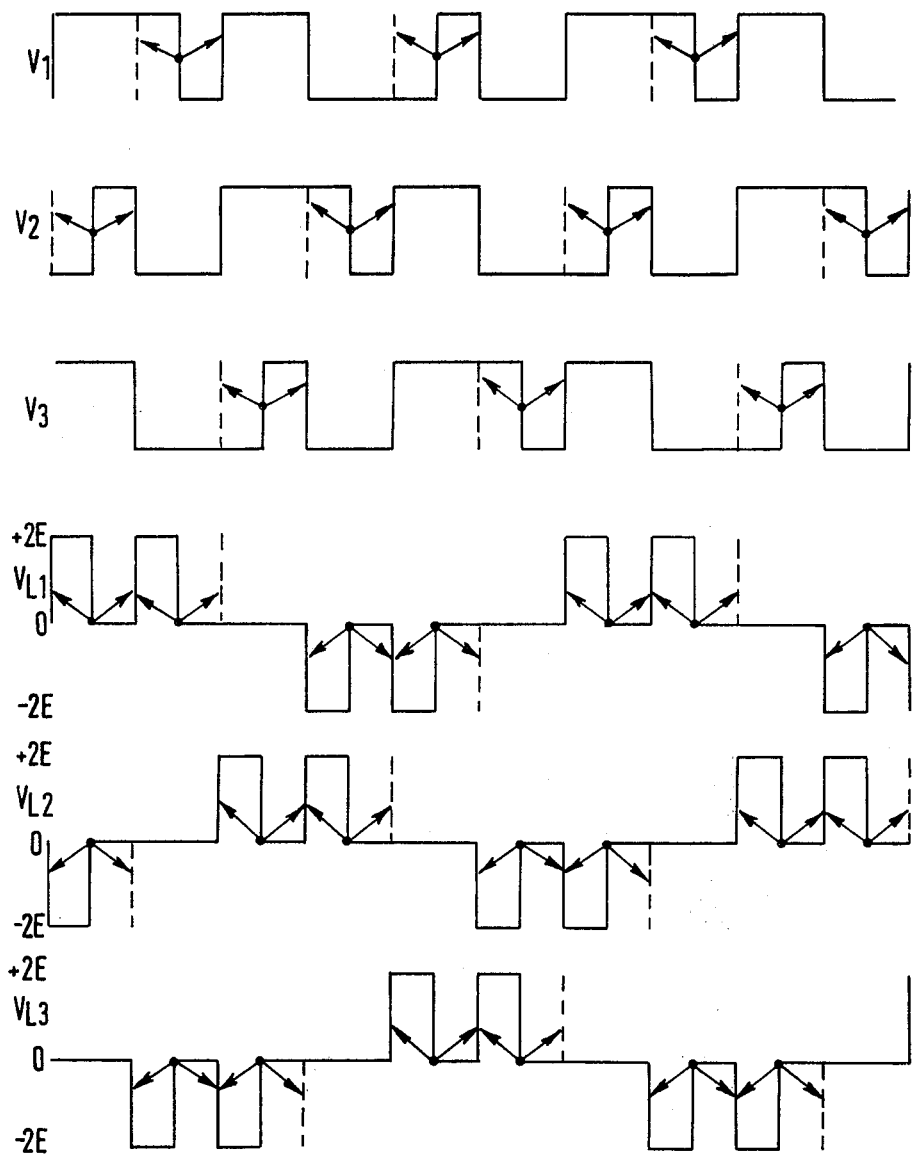
FIG. 2 is a set of waveform diagrams corresponding to the waveforms at selected points in the synthesiser of FIG. 1.

Referring now to FIGS. 1 and 2, the three-phase square waves from a twisted ring counter are chopped in the manner described, before being used to switch a static inverter. The chopping pulse generator produces a pulse y six times every period having a duration $T_s/6$ where $T_s$ is a selected period. The pulse is then inverted and the inverted $\bar{y}$ chops each phase square wave twice during every period within the ranges and up to the maximum width stated above. Since the period of pulse y is fixed, the width of chop pulse $\bar{y}$ increases automatically as T is increased. The result is an automatic control of the mean of the variable frequency three-phase line voltage amplitude which is useful in achieving a simple variable speed, constant torque output, control of a three-phase AC motor. FIG. 1 is a block diagram of a circuit which realises this preferred embodiment. A variable frequency clock pulse generator 10 feeds clock pulses at a variable frequency $6f_1$ to a twisted ring counter 12 incorporating three J-K flip-flops $FF_1$, $FF_2$, $FF_3$, having outputs $Q_1$, $Q_2$, $Q_3$, and "complemented" or "inverted" outputs $\bar{Q_1}$, $\bar{Q_2}$, $\bar{Q_3}$, respectively. The three-phase square waves of period $T_1 = 1/f_1$ are obtained from the outputs $Q_1$, $Q_3$, $Q_2$. The clock pulse generator 10 also triggers the chopping pulse generator 14 which produces positive going pulses y at the rate of one every $T_1/6$. An example of a simple chopping pulse generator would be a monostable multivibrator. The chopping pulse period for each phase is selected by channelling the inverted pulse $\bar{y}$ through AND gates 16a, 16b, and 16c which are "opened" or "enabled" by signals from the EXCLUSIVE-OR gates 18a, 18b, and 18c, as shown. The latter EXCLUSIVE-OR gates are fed with signals from the ring counter 12 as shown in the figure, such that the AND gates are enabled in correct sequence twice during each period for each phase. The channelled $\bar{y}$ pulses from the AND gates 16 are then mixed with the three-phase square waves $Q_1$, $Q_3$, $\bar{Q_2}$ in EXCLUSIVE-OR gates 20a, 20b, and 20c respectively. The resulting chopped square wave phase signals $V_1$, $V_2$, $V_3$ from the EXCLUSIVE-OR gates 20 which switch the static inverter 19 are shown in FIG. 2 together with the resulting line voltages $V_{L1}$, $V_{L2}$, $V_{L3}$, across the AC load. At zero chop, when pulse y has width $T_1/6$, the original three-phase square wave trains $Q_1$, $Q_3$, $\bar{Q_2}$ emerge unaltered from their respective EXCLUSIVE-OR gates 20 while at maximum chop, when pulse y has width very much less than $T_1/6$, the original square wave trains are chopped to square wave trains of 1:1 mark-space ratio and of three times the original frequency so that the resulting line voltages from the inverter across the load are zero.

Such a simple waveform generator is only of use as an AC motor speed control over limited ranges of speed about the design speed of the motor because of the poor quality of the line voltage waveform.

In a second embodiment of the invention, the quality of the line voltage waveform is markedly improved when the phase voltages $V_1$, $V_2$, $V_3$ are treated as chopped square wave Walsh functions of fixed frequency $f_1$ and multiplied with another square wave Walsh function of variable frequency $f_2$. Walsh functions are orthogonal functions analogous to sine and cosine functions and form the basis of a communication theory which is useful in dealing with binary information since Walsh functions may assume the values of ±1 only. As with sine functions multiplication of two Walsh functions will yield a difference frequency product. A suitable Walsh function multiplier is an EXCLUSIVE-OR gate (or EQUIVALENCE gate). Such multiplication of $V_1$, $V_2$, $V_3$ as mentioned above will result in the production of three-phase chopped p.w.m. Walsh function waveforms of beat frequency the difference in frequency $f_2 - f_1$, and of sequency (one half of the average number of switchings per unit time) the sum of the frequencies $f_2 + f_1$.

Figure 3:
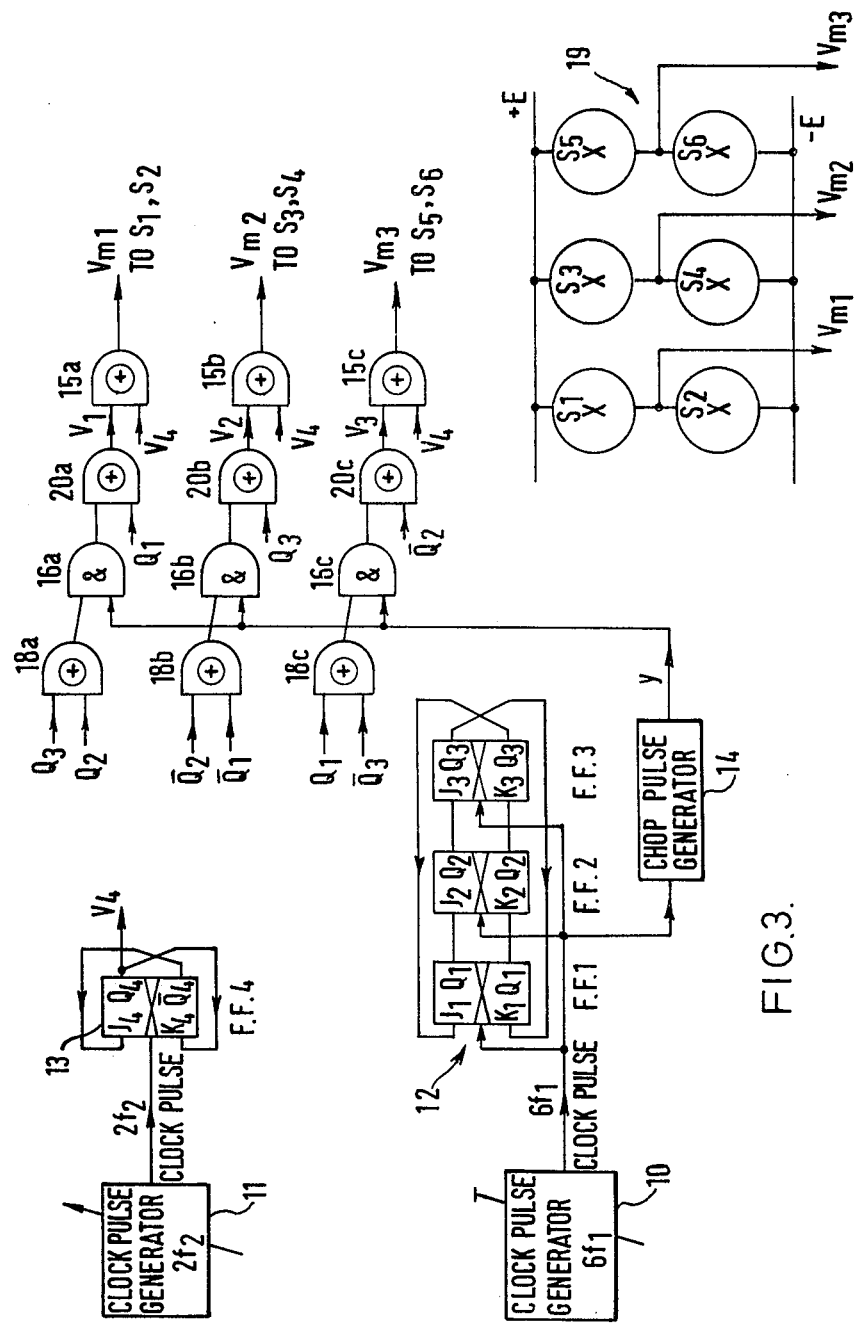
FIG. 3 is a block diagram of a second form of waveform synthesiser in use as a three-phase AC motor drive.
Figure 4:
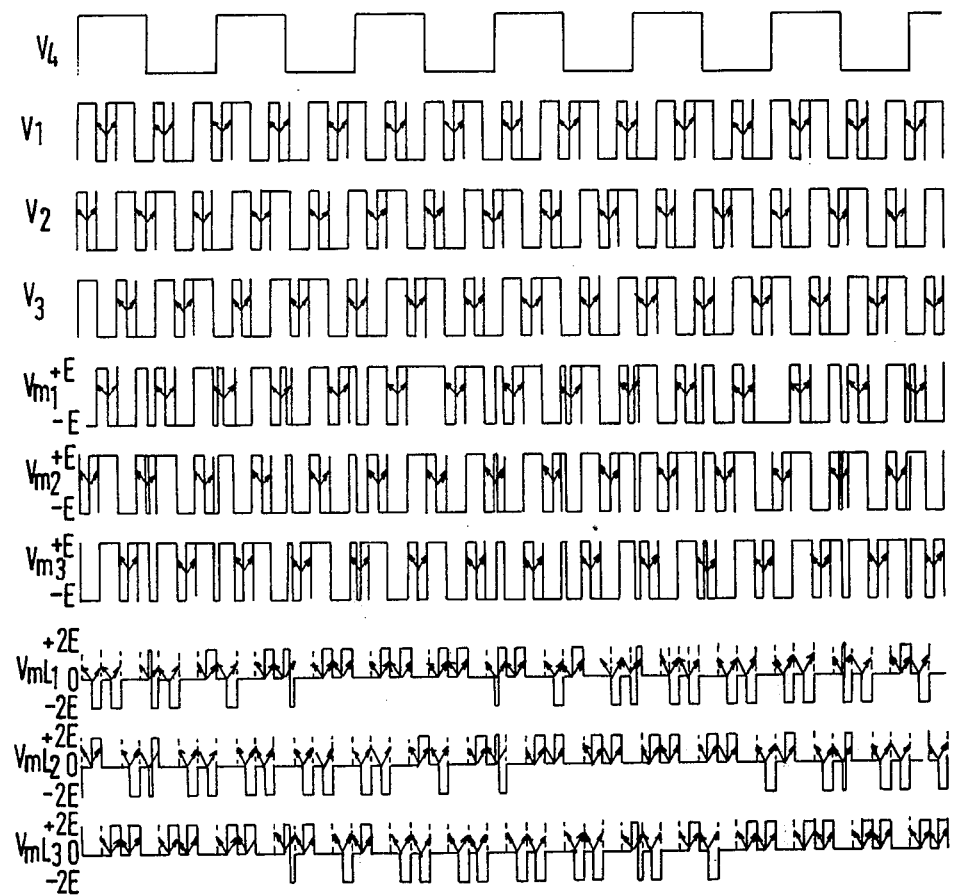
FIG. 4 is a set of waveform diagrams corresponding to the waveforms at selected points in the synthesiser of FIG. 3.

Referring now to FIGS. 3 and 4 the same circuit is used to generate the chopped three-phase voltages $V_1$, $V_2$, $V_3$ (these may be referred to as the base voltages) as is used in the simple system previously described except that pulse $y$ of width variable from zero up to $1/6f_1$ seconds is used for the chop, and the frequency $6f_1$ of the clock pulse generator 10 is preset to a constant value. Another clock pulse generator 11 of variable frequency $2f_2$ feeds clock pulses to a twisted ring counter 13 incorporating one J-K flip-flop $FF_4$ which has an output $Q_4$. The output from $Q_4$ is a square wave voltage $V_4$ of frequency $f_2$ (which may be referred to as the control voltage) which is mixed with each of the chopped three phase square wave voltages $V_1$, $V_2$, $V_3$ in the respective EXCLUSIVE-OR gates 15a, 15b, 15c as shown in the block diagram of the circuit realisation, FIG. 3. The resulting three-phase chopped p.w.m. waves $V_{m1}$, $V_{m2}$, $V_{m3}$ from the EXCLUSIVE-OR gates 15, which are used to switch the static inverter 19, are shown in FIG. 4, together with the resulting line voltages $V_{mL1}$, $V_{mL2}$, $V_{mL3}$. With this embodiment it should be appreciated that:

a. The pulse width of each unchopped p.w.m. waveform $Vm_1$, $Vm_2$, or $Vm_3$ at any instant of time relates to the instantaneous amplitude of a triangular waveform of fundamental frequency $f_2 - f_1$ rather than that of a sinusoid of this beat frequency, but this is a significant improvement over the square wave approximation to a sinusoid in the simple system already described.

b. The switching sequency $f_2 + f_1$ may be made as large or as small as desired so that the number of line voltage pulses per unit time may be adjusted at will.

c. Since the beat or difference frequency $f_2 - f_1$ may be positive or negative, the direction of rotation of a three-phase AC motor driven by this generator is dependant only on whether $f_2$ is greater or less than $f_1$. Reversal of rotation is thus possible without the need for any switching.

d. A programmable chop pulse $y$ is used rather than its inverted form. When used as previously described it controls the balanced mean line voltages $V_{mL1}$, $V_{mL2}$, $V_{mL3}$ between maximum and zero as the programmable chop pulse generator varies the chopping pulse width between 0 and $1/6f_1$ seconds. The amplitude of the harmonics are also reduced as the chop width is increased so that when the fundamental voltage amplitude is reduced to zero the three-phase load is not supplied with residual harmonics. When the chop is programmed to the requirements of a particular AC motor it ensures that the desired torque output is obtained from the machine at all machine speeds by controlling the voltage-time product of the supply voltage. This control is both positive and accurate.

In a less preferred variation the control square wave could be chopped before being multiplied with the respective phases of the base square wave.

Such a sophisticated switching system may, in practice, make heavy demands on the ability of the static inverter to switch power rapidly and efficiently. This is particularly so when chop is employed and the switching frequency $f_2 + f_1$ is high. If this is so, a practical improvement may be introduced to alter the mode of operation of the inverter and thus reduce the inverter switching rate.

The normal two-state mode of operation of the static inverter is that of a switching circuit with each output phase switched to one of two distinct voltage levels only, according to whether the upper level switch or the lower level switch is closed at that instant in time. If the static inverter incorporates a means of feedback across its switches, the switching rate of the inverter may be significantly reduced by a change to a tri-state mode of operation.

Accordingly, in a third embodiment of the invention the inverter phase output may be the result of:

a. The upper level switch being closed so that the output is connected to the upper level d.c. bus voltage, or b. The lower level switch being closed so that the output is connected to the lower level d.c. bus voltage, or c. Neither the upper nor the lower level switch being closed so that the output voltage is determined by the load current which will then flow through the feedback means across the switches. If these be feedback diodes and if the load is a significantly inductive circuit, then the phase voltage will swing either to the upper d.c. bus voltage or the lower d.c. bus voltage level so as to ensure the continuation of load current flow through the appropriate feedback diode.

Condition (c) allows an inverter drive circuit which need not produce high switching rate outputs to attain a waveform which upon integration will approximate a sine wave. The upper and lower level switches of the inverter must, of course, be switched independently and it has been found that by mixing the voltages $V_1$, $V_2$, $V_3$ with voltage $V_4$ in AND gates, both inverter switches will be turned off at appropriate times in the switching sequence. Other methods can of course be used to produce a suitable drive for the tri-state inverter.

Figure 5:
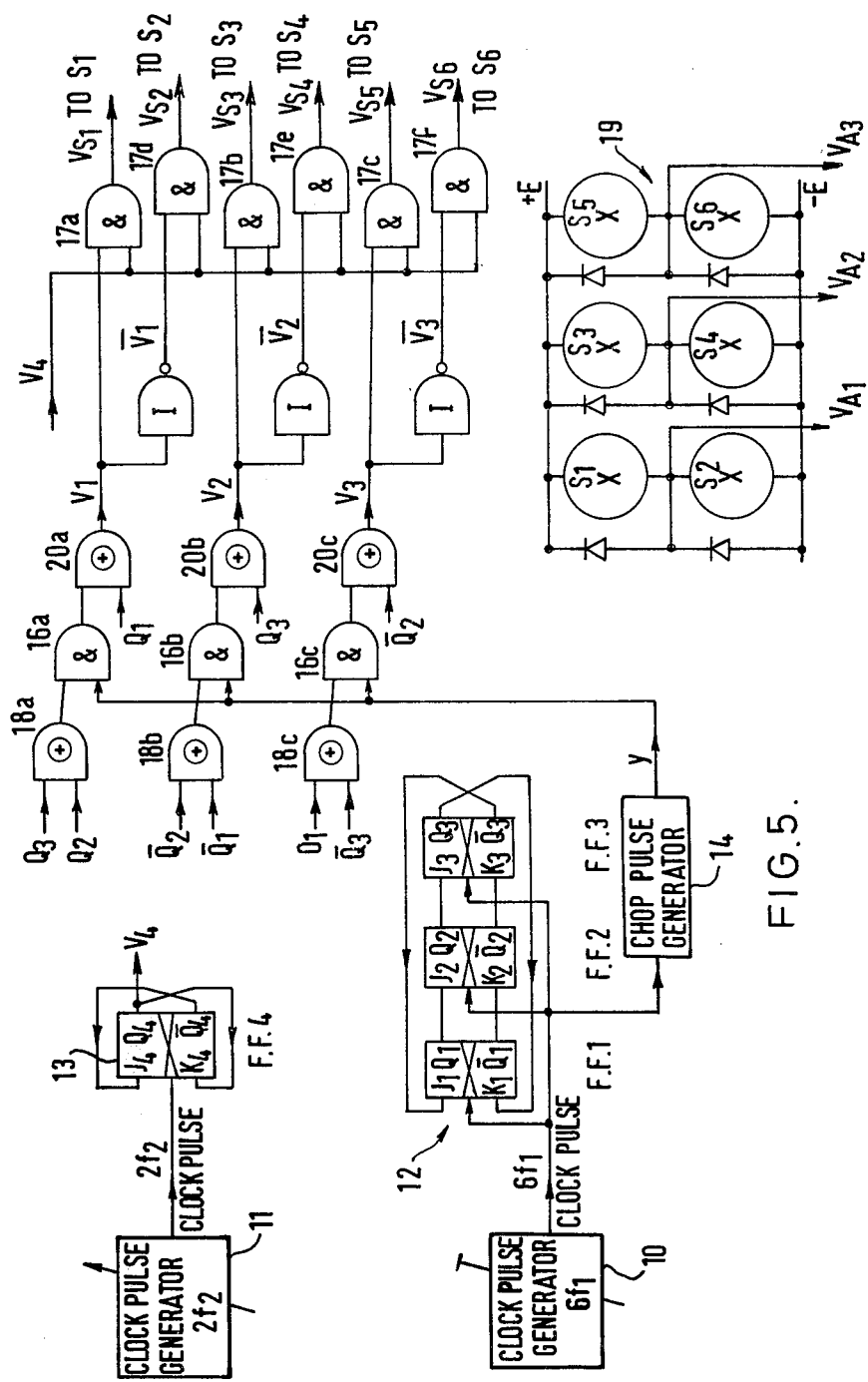
FIG. 5 is a block diagram of a third form of waveform synthesiser in use as a three-phase AC motor drive.
Figure 6:
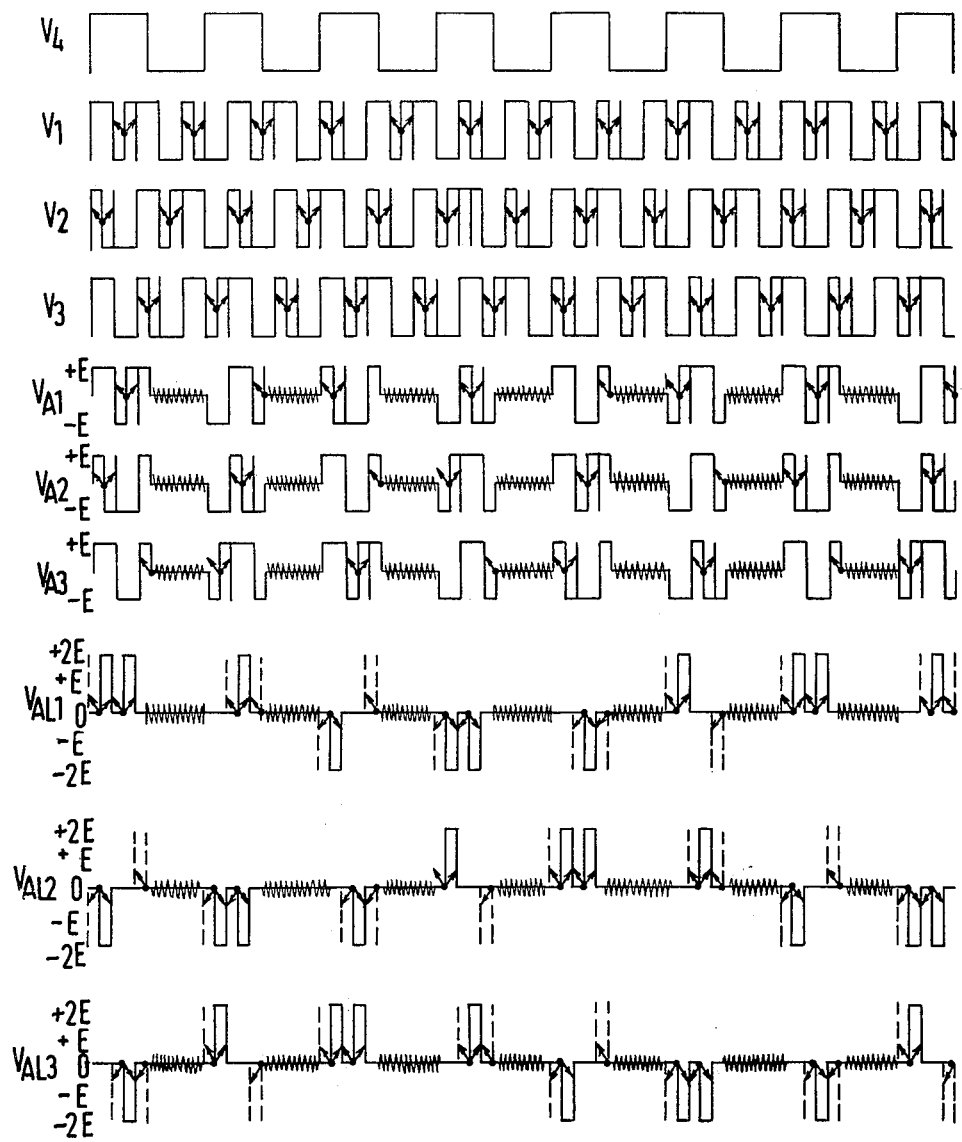
FIG. 6 is a set of waveform diagrams corresponding to the waveforms at selected points in the synthesiser of FIG. 5.

Referring now to FIGS. 5 and 6 the same circuit is used to generate the chopped three-phase voltages $V_1$, $V_2$, $V_3$ as is used in the simple system previously described. Like the sophisticated p.w.m. system just described, the frequency $6f_1$ of the clock pulse generator 10 is pre-set to a constant value and the pulse $y$ of width variable from zero up to $1/6f_1$ seconds is used for the chop. Again, a clock pulse generator 11 of variable frequency $2f_2$ feeds clock pulses to a twisted ring counter 13 incorporating one J-K flip-flip $FF_4$ which has an output $Q_4$. The output from $Q_4$ is a square wave voltage $V_4$ of frequency $f_2$ which is partially mixed with each of the chopped three-phase square wave voltages $V_1$, $V_2$, $V_3$ in the respective AND gates 17a, 17b 17c and also partially mixed with each of the inverted chopped three-phase square wave voltages $\overline{V}_1$, $\overline{V}_2$, $\overline{V}_3$ in the respective AND gates 17d, 17e, 17f as shown in the block diagram of the circuit realisation, FIG. 5. The three-phase output voltages $V_{S1}$, $V_{S3}$, $V_{S5}$ from AND gates 17a, 17b, and 17c are used to switch the upper level switches $S_1$, $S_3$, $S_5$ respectively, of the static inverter 19 while the three-phase output voltages $V_{S2}$, $V_{S4}$, $V_{S6}$ from AND gates 17d, 17e and 17f are used to switch the lower level switches $S_2$, $S_4$, $S_6$ respectively, of the static invertor 19. The resultant phase voltages $V_{A1}$, $V_{A2}$, $V_{A3}$ from the static inverter are shown in FIG. 6, together with the resultant line voltages $V_{AL1}$, $V_{AL2}$, $V_{AL3}$. Since the phase voltages are load dependent while the inverter is switched off, the voltages at these times are represented by blurred lines. It is apparent that the performance of this system using the tri-state mode of operation of the inverter compares well with that of the sophisticated system already described, while the switching speed of the inverter is significantly reduced.

Figure 7:
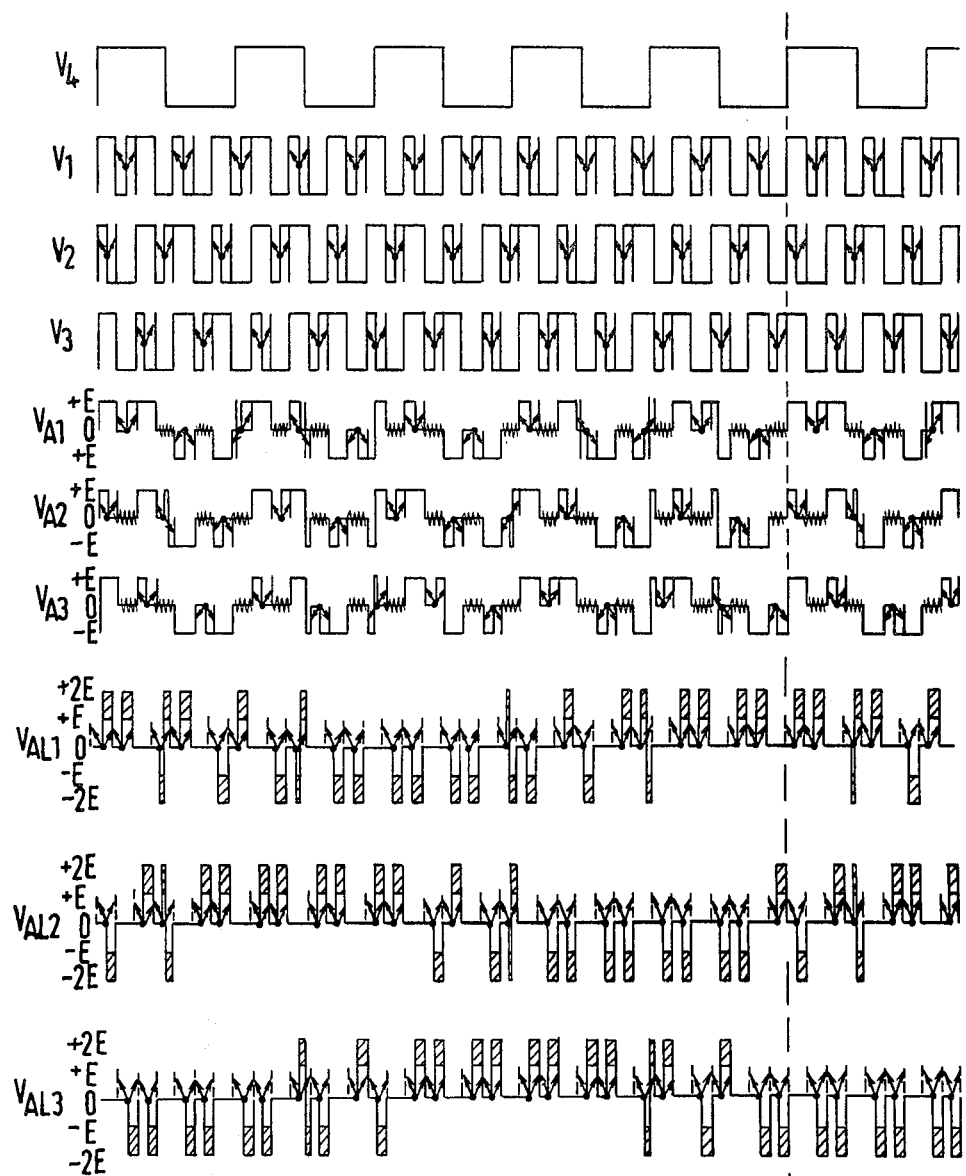
FIG. 7 is a set of waveform diagrams corresponding to the waveforms at selected points of a variation of the synthesiser of FIG. 5.

In another suitable low switching rate inverter drive circuit for switching the inverter in the tri-state mode, the inputs to AND gates 17a, 17b, 17c remain unchanged but the inputs to AND gates 17d, 17e 17f are changed to $V_1$ and $\overline{V}_4$, $V_2$ and $\overline{V}_4$, $V_3$ and $\overline{V}_4$ respectively. In this case the resultant phase voltages from the static inverter are shown in FIG. 7 together with the resultant line voltages $V_{AL1}$, $V_{AL2}$, $V_{AL3}$. Again, since the phase voltages are load dependent while the inverter is switched off, the voltages at these times are represented by blurred lines. Other means of switching the inverter in the tri-state mode are readily available but will not be detailed here.

In any system in which the difference of two frequencies $f_2 - f_1$ is taken, the difference frequency is very sensitive to small changes in $f_2$ and $f_1$. This is especially so when $f_2 - f_1$ is small and $f_1$ and $f_2$ are large. In the speed control of AC motors by the waveform synthesisers of the second and third forms of waveform synthesiser, the difference frequency should be able to be specified at the input and varied continuously or in constant increments through a range of frequencies. It is essential that whatever the difference frequency set at the input, the difference frequency of the output waveform is identical to this at all times. When a stable difference frequency is required, a common method of achieving this is to use one stable master oscillator of frequency $f_o$ and to divide this down to the two frequencies $f_1$ and $f_2$ required using digital dividers.

When $f_o$ is a fixed frequency this method is satisfactory for the generation of the fixed clock frequency $6f_1$ but it is unsatisfactory for the generation of variable clock frequency $2f_2$, since the frequency needs to be set and varied in constant increments throughout the required frequency range. Varying the divisor in constant increments will not of course achieve this. Thus with the second and third forms of the waveform synthesiser, clock pulses of an accurate and stable pre-set frequency $nf_2/m$ may be generated by dividing the output frequency $f_o$ of a stable high frequency master clock pulse oscillator by $f_2/m$ in a digital divider of variable divisor $f_2/m$. The output pulses of repetition frequency $mf_o/f_2$ are then fed into a digital up/reset counter enabled $n$ times/second for $1/n$ seconds to output in parallel form the serial pulse rate. The count accumulated here is proportional to the period of $f_2$ and is of value $m/n\, f_o/f_2$. This count is used as the variable divisor of a digital divider which divides the output frequency $f_o$ of the high frequency master clock oscillator. The output pulses of this divider are of the required clock pulse frequency (viz. $f_o / \dfrac{mf_o}{nf_2}$ It should be noted that if $n = f_o/K_2$ where $K_2$ is the fixed divisor of a digital divider which divides $f_o$ to produce $n$, then the percentage drift of $f_2$ is the percentage drift of $f_o$.

Figure 8:
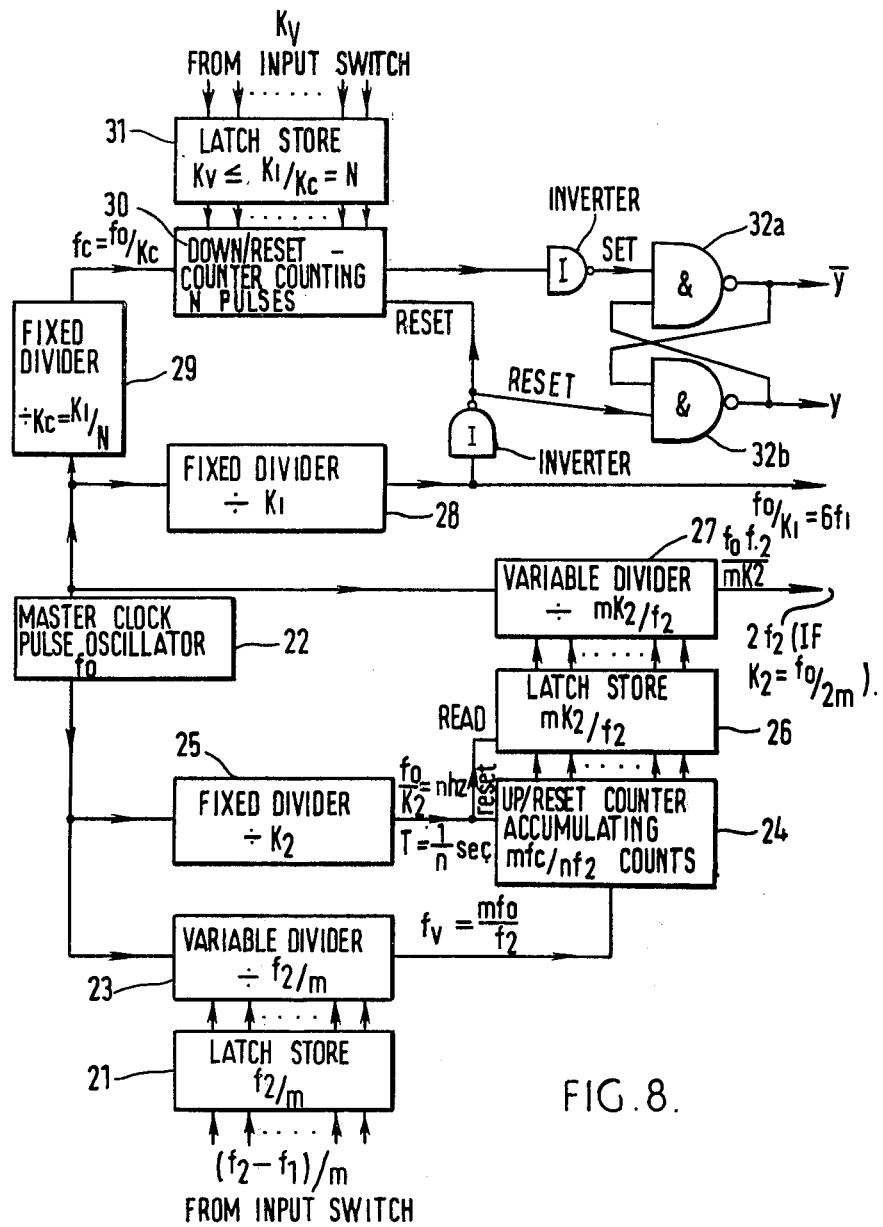
FIG. 8 is a block diagram of a timing pulse generator producing pulses for use in waveform synthesisers, particularly when used as three-phase AC motor drives.

Referring now to FIG. 8 (the lower half of the block diagram) and the waveform synthesisers described pulse frequency $6f_1$ is obtained by dividing the stable master clock frequency $f_o$ by a constant $K_1$ made equal to the expected value of $f_o/6f_1$ so that again percentage errors in $f_1 = f_o/6K_1$ are the percentage errors in $f_o$. The variable clock pulse frequency $2f_2$ is obtained as described. Since frequency $f_1$ is fixed, the input $f_2$ may be calibrated exactly as difference frequency $$\frac{f_2 - f_1}{m}$$

where $m$ is any required scale factor. The input digital latch store 21 accepts input frequency $f_2/m$ and stores this as the variable divisor of the digital divider 23 which divides the output frequency $f_o$ of the master clock pulse oscillator 22. The clock pulse output of divider 23 of frequency $mf_o/f_2$ is fed to count up the digital up-reset counter 24. This counter is enabled $f_o/K_2 = n$ times a second for $1/n$ seconds by the output of digital divider 25. Each accumulated count of the counter 24 of value $mK_2/f_2$ is fed to the digital latch store 26 which stores this number, proportional to the period of $f_2$, as the variable divisor of digital divider 27. The output of this divider is $f_of_2/mK_2$ and if $K_2 = f_o/2m$ then the output clock pulses are of the required frequency $2f_2$. Note that since the percentage error in both $f_1$ and $f_2$ are the same as the percentage error in $f_o$ and always in the same sense, the percentage error of $f_2 - f_1$ is simply the percentage error of $f_o$, whatever the difference frequency.

As can be seen from the upper half of the block diagram of FIG. 8, the chop pulse $y$ for a synthesiser as described may also be realised accurately by digital methods. Clock pulses of frequency $f_o/K_c$ (where $K_c = K_1/N$) from the fixed divider 29 are fed to a down/reset counter 30. This counter is reset by clock pulses from the fixed divider 28 which are of period $K_1/f_o = 1/6f_1$. Thus in any sixth of a period $1/6f_1$, $f_o/K_cK_1/f_o = N$ pulses count down the counter 30. During each reset period, a variable number $K_v$ which is stored in latch store 31, is read into the counter 30. Since this number $K_v$ is not greater $K_1/K_c = N$, a pulse will be obtained from down counter 30 each sixth of a period $1/6f_1$ when counter 30 counts through zero. The reset pulse to the counter 30 also resets the NAND gate latch 32 so that $y$ is level 1 and $\bar{y}$ is level 0. The output pulse from counter 30 which occurs when it counts through zero, sets the NAND gate latch again so that $y$ is level 0 and $\bar{y}$ is level 1. Thus chop pulse $y$ is accurately at level 1 for $K_v/N$ of a sixth of a period $T_1$ and this occurs each $T_1/6$, where $T_1 = 1/f_1$. Input $K_v$ is from the input switches controlling beat frequency $f_2 - f_1$, so the chop $y$ may be arbitrarily but accurately adjusted to any desired value at any beat frequency. This is necessary when the system is used to control the speed of an AC motor, since the chop may be accurately adjusted to obtain the desired amplitude/frequency relationship required for the motor characteristic.

When $f_o$ is a continuously variable frequency, then an alternative and much simpler realisation may be obtained in which two fixed digital dividers are used to generate frequencies $f_1 = f_o/K_1$ and $f_2 = f_o/K_2$. The beat or difference frequency is then:

$$f_D = f_1 - f_2 = f_o \cdot \left| \frac{K_2 - K_1}{K_2 K_1} \right|$$

where the vertical lines imply "the magnitude of". The percentage error in $f_D$ is thus simply the percentage error in $f_o$. When the master oscillator frequency $f_o$ is continuously variable over the range $0 - f_o - f_{o\,MAX}$, the difference frequency will be continuously variable over the range $0 - f_D - f_{o\,MAX}$ $$\frac{K_1 - K_2}{K_1 K_2}.$$

Figure 9:
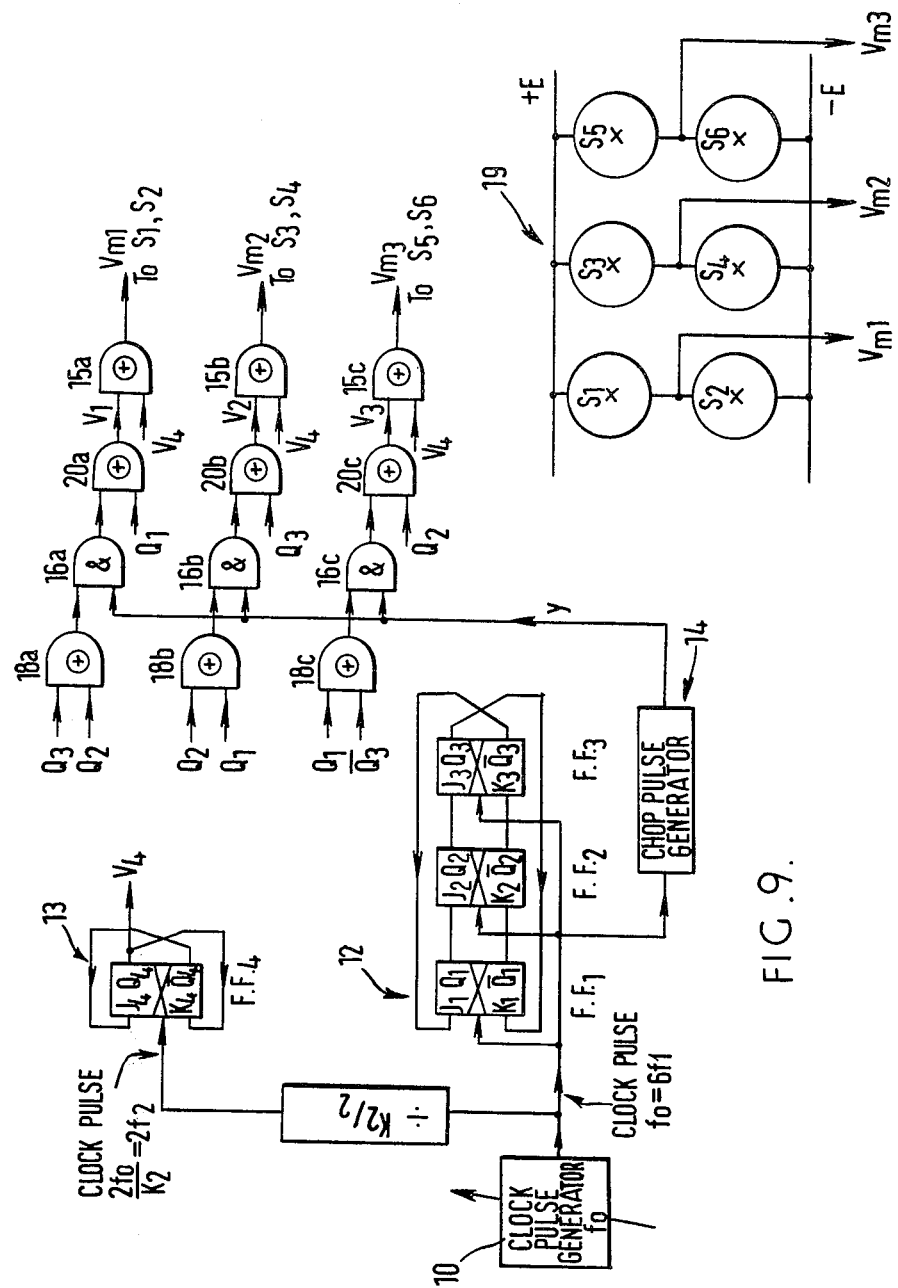
FIG. 9 is a block diagram of a synthesiser of the type shown in FIG. 3 showing an alternative method of providing the synthesiser with timing pulses.
Figure 10:
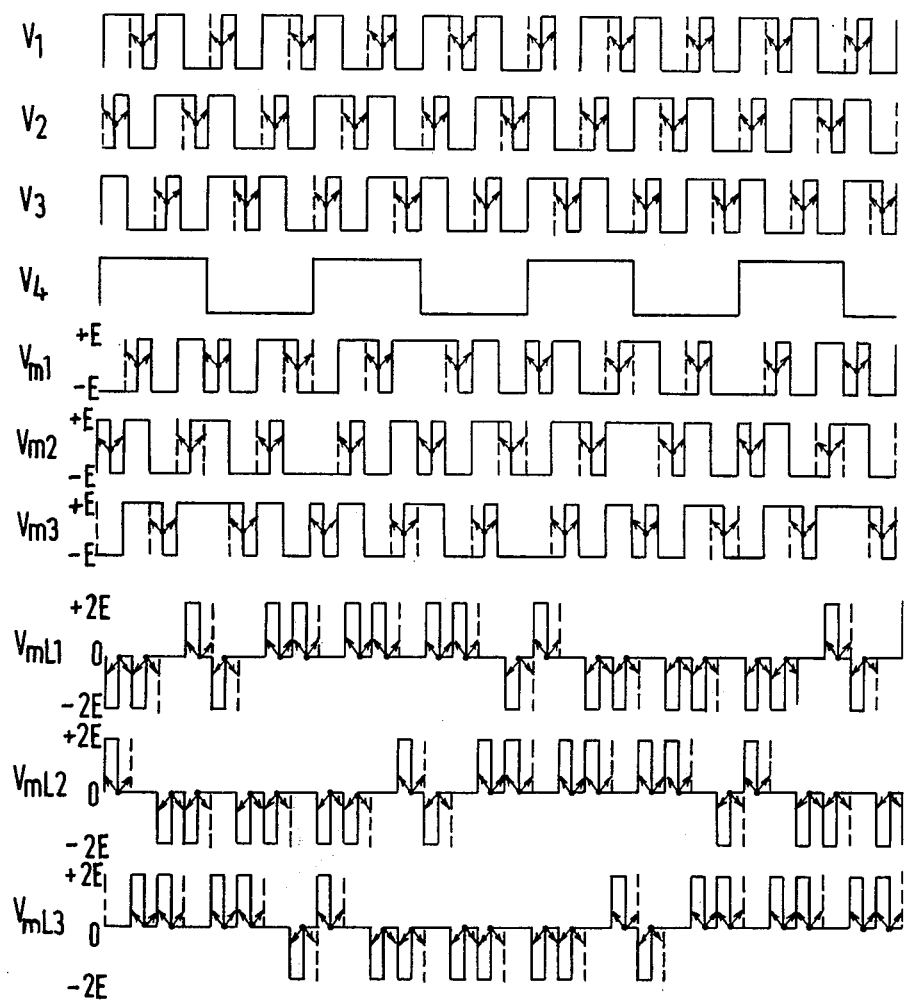
FIG. 10 is a set of waveform diagrams corresponding to the waveforms at selected points in the synthesiser of FIG. 9.

Referring now to FIG. 9, the same circuit is used to generate the chopped three phase voltages $V_1$, $V_2$, $V_3$ as is used in the systems previously described in FIGS. 1 and 3. Chopping pulse $y$ of width variable as required from zero to $1/6f_1$ seconds, is used for the chop and the frequency of the clock pulse generator 10 is continuously variable between 0Hz and $f_{o\ MAX}$. In this simple embodiment $K_1 = 6$ and the divisor $K_2$ is fixed at some appropriate value which permits suitable line voltage waveforms to be obtained from the inverter, while the inverter switching rate is kept within permitted limits. It should be appreciated that:

(a) $$f_o = \frac{K_1 K_2}{K_1 - K_2} f_D$$

and thus if $f_{D\ MAX} = 50$ Hz, $K_1 = 6$, $K_2 = 8$ then $f_{o\ MAX} = 1200$ Hz. The waveforms obtained in this case are shown in FIG. 10.

b. For this simple realisation of the p.w.m. waveforms, while the difference frequency is directly proportional to the frequency of the clock pulse generator $f_o$, so too is the switching sequency (the sum frequency). Unlike the other methods previously described, since $K_2$ can be varied the number of line voltage pulses per period can be kept independent of $f_o$ but dependent on the values of $K_1$ and $K_2$. If $K_1$ remains constant the number of pulses per period at any given value of difference frequency $f_D$, may be adjusted to an appropriate value by switching $K_2$, provided that the clock pulse frequency $f_o$ is simultaneously switched to maintain the desired $f_D$. The effect of switching in this manner is akin to mechanical gear changing and can be thus termed "electronic gear changing".

c. If need be, the motor being controlled may be reversed by extending the range of $f_D$ to include:

$$-f_o\ MAX \cdot \frac{K_1 - K_2}{K_1 K_2} - f_D \leq f_o\ MAX \cdot \frac{K_1 - K_2}{K_1 K_2}$$

as $0 \leq f_o \leq f_{o\ MAX}$, by switching $f_1 = f_o/K_1$ to $f_1 = f_o/K_2$ at the same time as $f_2 = f_o/K_2$ is switched to $f_2 = f_o/K_1$ when frequency $f_o = 0$ Hz. Alternatively for a three phase output, one pair of the three phase output voltages (preferably the low level logic output voltages) may be interchanged when $f_o = 0$ Hz to achieve the same effect.

It should be understood that in this specification where a "phase" is referred to this includes the waveform of a synthesiser which has only one output (i.e. a single phase synthesiser) rather than a poly-phase output. Further, is should be understood that, while the preferred embodiments shop in the range of T/6 to T/3 and 2T/3 to 5T/6, chopping in other ranges of the base square wave period could be used.

What we claim is:

1. A method for synthesising a waveform which upon integration will approximate a sinusoid having an amplitude proportional to frequency comprising: generating at least one base square wave having a selected frequency, generating a pulse waveform consisting of a fixed duration pulse occurring at least once each square wave half cycle, inverting said pulse waveform, enabling said inverted pulse waveform for a predetermined fraction of each square wave half cycle, and chopping said square wave with said enabled waveform.

2. A method according to claim 1 wherein said enabling period is from T/6 to T/3 and 2T/3 to 5T/6, where T is the square wave period.

3. A method according to claim 2 wherein the leading edges of said fixed duration pulses are located at T/6 and 2T/3 and have a duration of $T_s/6$, where $T_x$ is a selected minimum period of said square wave.

4. A method according to claim 1 wherein a plurality of square waves are generated of equal fundamental frequency but differing in phase by equal angles to form a poly-phase system and the waveforms of each phase are combined to produce the desired waveform.

5. A method according to claim 4 wherein three square waves are generated of equal fundamental frequency but differing in phase by equal angles to form a three-phase system and the waveforms of each phase are combined to produce the desired waveform.

6. A method of generating variable frequency supply power for an AC motor in accordance with claim 5.

7. A method for synthesising a waveform which upon integration will approximate a sinusoid of controllable amplitude comprising: generating at least one base square wave having a selected frequency, chopping each square wave once each half cycle with a chopping pulse having a width proportional to the desired amplitude of the sinusoid, generating a control square wave of different fundamental frequency,, and Walsh multiplying said control square wave with the or each chopped square wave to produce a chopped pulse width modulated waveform having a fundamental frequency equal to the difference of the fundamental frequencies of the control and base square waves.

8. A method according to claim 7 wherein the width of the chopping pulse is a function of the difference of the fundamental frequencies of the control and base square waves.

9. A method according to claim 7 wherein a plurality of square waves are generated of equal fundamental frequency but differing in phase by equal angles to form a poly-phase system and the waveforms of each phase are combined to produce the desired waveform.

10. A method according to claim 9 wherein the three square waves are generated of equal fundamental frequency but differing in phase by equal angles to form a three-phase system and the waveforms of each phase are combined to produce the desired waveform.

11. A method of generating variable frequency supply power for an AC motor in accordance with claim 10.

12. A method according to claim 7 wherein the base and control square waves are derived from first and second pulse waves respectively which are produced by generating a pulse wave of frequency $f_0$ which is continuously variable, dividing the pulse wave in a first dividing process by a factor $K_1$ to produce said first pulse wave, dividing the pulse wave in a second dividing process by a factor $K_2$ to produce said second pulse wave, the two pulse waves having a fundamental frequency difference equal to $$\frac{K_2 - K_1}{K_1 K_2} f_o.$$

13. A method according to claim 12 wherein $K_1$ is fixed and $K_2$ is varied in inverse proportion to $f_o$ such that the sum of the pulse wave frequencies is kept constant.

14. A method according to claim 7 wherein the control and base square waves are derived from first and second pulse waves respectively which are produced by generating a fixed frequency pulse wave, dividing said pulse wave in a first dividing process by a fixed factor $K_1$ to produce said first pulse wave, dividing the pulse wave in a second dividing process by a variable factor $K_2$ to produce said second pulse wave, the second division process being performed by setting the first store with a number representing the desired difference frequency, dividing said pulse wave by a first divider with a divisor set by and equal to the number in the first store, counting the serial output of said first divider to convert this output to parallel form, setting a second store with the number accumulated in said counter in a pre-set time interval, and dividing said pulse wave by a second divider having a divisor set by and equal to the number in said second store.

15. A method for synthesising a waveform which upon integration will approximate a sinusoid of controllable amplitude comprising: generating at least one base square wave having a selected frequency, chopping each square wave once each half cycle with a chopping pulse having a width proportional to the desired amplitude of the sinusoid, generatng a control square wave of different fundamental frequency, partially Walsh multiplying said control square wave with each chopped square wave to produce a chopped pulse width modulated waveform having a fundamental frequency equal to the difference of the fundamental frequencies of the control and base square waves, partially Walsh multiplying the complementary forms of said base square waves with the control square wave or the complementary form of the control square wave is partially Walsh multiplied with each base square wave, to produce dual waveforms with the levels of each waveform of a dual being the same for one state only at some time in the switching sequence, and converting these dual waveforms to single bi-directional tri-state waveforms.

16. A method according to claim 15 wherein the width of the chopping pulse is a function of the difference of the fundamental frequencies of the control and base square waves.

17. A method according to claim 15 wherein a plurality of square waves are generated of equal fundamental frequency but differing in phase by equal angles to form a poly-base system and the waveforms of each phase are combined to produce the desired waveform.

18. A method according to claim 17 wherein three square waves are generated of equal fundamental frequency but differing in phase by equal angles to form a three-phase system and the waveforms of each phase are combined to produce the desired waveform.

19. A method of generating variable frequency supply power for an AC motor in accordance with claim 18.

20. A method according to claim 15 wherein the base and control square waves are derived from first and second pulse waves respectively which are produced by generating a pulse wave of frequency $f_o$ which is continuously variable dividing the pulse wave in a first dividing process by a factor $K_1$ to produce said first pulse wave, dividing the pulse wave in a second dividing process by a factor $K_2$ to produce said second pulse wave, the two pulse waves having a fundamental frequency difference equal to $$\frac{K_2 - K_1}{K_1 K_2} f_o.$$

21. A method according to claim 20 wherein $K_1$ is fixed and $K_2$ is varied in inverse proportion to $f_o$ such that the sum of the pulse wave frequencies is kept constant.

22. A method according to claim 15 wherein the control and base square waves are derived from first and second pulse waves respectively which are produced by generating a fixed frequency pulse wave, dividing said pulse wave in a first dividing process by a fixed factor $K_1$ to produce said first pulse wave, dividing the pulse wave in a second dividing process by a variable factor $K_2$ to produce said second pulse wave, the second division process being performed by setting the first store with a number representing the desired difference frequency, dividing said pulse wave by a first divider with a divisor set by an equal to the number in the first store, counting the serial output of said first divider to convert this output to parallel form, setting a second store with the number accumulated in said counter in a pre-set time interval, and dividing said pulse wave by a second divider having a divisor set by and equal to the number in said second store.

23. A waveform synthesiser for producing a waveform which upon integration will approximate a sinusoidal having an amplitude proportional to frequency comprising: a square wave generator producing at least one base square wave, a pule waveform producing a waveform consisting of a fixed duration occurring at least once each square wave half cycle, an inverter fed from said pulse waveform generator, logic circuitry associated with the square wave generator which enables the inverter output for a predetermined fraction of each square wave half cycle, and means for mixing or chopping each square wave with the output from said logic circuitry.

24. A waveform synthesiser according to claim 23, wherein said logic circuitry enables the inverter output from T/6 to T/3 and 2T/3 to 5T/6, where T is the square wave period.

25. A waveform synthesiser according to claim 24, wherein said pulse waveform generator produces pulses having leading edges at T/6 to 2T/3 and having a duration of $T_s/6$, where $T_s$ is a selected minimum period of said square wave.

26. A waveform synthesiser according to claim 23 wherein said square wave generator is a poly-phase generator.

27. A waveform synthesiser according to claim 26 wherein said square wave generator is a three-phase generator.

28. A waveform synthesiser according to claim 27 wherein said square wave generator comprises a clock pulse generator which triggers a three flip-flop twisted-ring counter and each phase is taken from the output of a flip-flop.

29. A waveform synthesiser according to claim 27 wherein the line waveforms are selected as the waveforms to be integrated.

30. A waveform synthesizer to claim 28 wherein said pulse waveform generator comprises a monostable multivibrator triggered by the output of said clock pulse generator.

31. A waveform synthesiser according to claim 23 wherein said means for mixing are EXCLUSIVE-OR gates.

32. A waveform synthesiser according to claim 27 wherein the synthesiser output stage is a high power static inverter.

33. A variable frequency AC motor drive including the synthesiser according to claim 32 wherein the or each inverter output can be connected to the or each phase winding of an AC motor.

34. A waveform synthesiser for producing a waveform which upon integration will approximate a sinusoid of controllable amplitude comprising: a square wave generator producing at least one base square wave, a variable width chopping pulse generator, producing a pulse the width which determines the amplitude of said sinusoid, logic circuitry associated with the square wave generator which sets the chopping pulse location relative to each half cycle of each square wave, means for mixing or gating each square wave with the chopping pulse, a second square wave generator producing a control square wave, and a Walsh multiplier means corresponding to each phase which is fed by the control square wave and the chopped square wave and provides as an output product the desired waveform in the form of a pulse width modulated waveform having a fundamental frequency equal to the difference of the fundamental frequencies of the control and base square waves.

35. A waveform synthesiser according to claim 34 wherein the chopping pulse generator produces a pulse having a width which is determined by the difference of the fundamental frequencies of the control and base square waves.

36. A waveform synthesiser according to claim 34 wherein the Walsh multiplier means is an EXCLUSIVE-OR gate.

37. A waveform synthesiser according to claim 34 wherein said square wave generator is a poly-phase generator.

38. A waveform synthesiser according to claim 37 wherein said square wave generator is a three-phase generator.

39. A waveform synthesiser according to claim 38 wherein the line waveforms are selected as the waveforms to be integrated.

40. A waveform synthesiser according to claim 38 wherein six chopping pulses are generated each base square wave period and the required two pulses per period for each phase are gated to said means for mixing by said logic circuitry.

41. A waveform synthesiser according to claim 34 wherein said means for mixing are EXCLUSIVE-OR gates.

42. A waveform synthesiser according to claim 38 wherein the synthesiser output stage is a high power static inverter.

43. A variable frequency AC motor drive including the synthesiser according to claim 42 wherein the or each inverter output can be connected to the or each phase winding of an AC motor.

44. A waveform synthesiser according to claim 34 wherein the control and base square wave generators include a common clock pulse generator which comprises: a master pulse oscillator having a continuously variable frequency, a fixed divider which divides down the pulses from the master oscillator by a factor $K_1$ to produce as an output a first pulse wave which is fed to the base generator, a variable divider which divides down the pulses from the master oscillator by a factor $K_2$ to produce as an output a second pulse wave which is fed to the control generator, the two pulse waves having a fundamental frequency difference equal to $$\frac{K_2 - K_1}{K_1 K_2} \cdot f_o$$

45. A waveform synthesiser according to claim 44 wherein the divisor of the variable divider is ganged with the master oscillator frequency in a manner which ensures that the sum of the frequencies of the first and second pulse waves remains constant with variations in oscillator frequency.

46. A waveform synthesiser according to claim 44 wherein the first and second pulse waves can be interchanged between outputs when $f_o = 0$ Hz.

47. A waveform synthesiser according to claim 34 wherein the control and base square wave generators include a common clock pulse generator which comprises a fixed frequency master pulse oscillator, a fixed divider fed from the master pulse oscillator which produces the base generator clock pulses, a variable divider fed from the master pulse oscillator composed of: a first store which may be set to hold a number representing the desired difference between the base and control square wave frequencies, a first divider fed by the master oscillator with a divisor set by and equal to the number in the first store, a counter fed with the serial output of said first divider to convert said output to parallel form, a second store which is set to hold a number accumulated in said counter in a pre-set time interval, a second divider fed by the master oscillator having a divisor set by and equal to the number in said second store providing as an output the control generator clock pulses.

48. A waveform synthesiser according to claim 47 wherein said counter is reset by pulses from the output of a fixed divider fed from said master oscillator, and said first and second dividers are down counters, the start count being determined by the number in the first and second stores respectively.

49. A waveform synthesiser according to claim 47 wherein the chopping pulse generator comprises: a bi-stable set by the base square wave generator clock pulses, a store into which a number is set which represents the desired chopping pulse width, a down counter the count of which is set by said store once every base generator clock pulse, means for deriving pulses having a frequency which is a multiple of the base generator clock pulses, said counter being fed by these pulses and providing an output at zero count which resets the bi-stable, the chopping pulses being taken from the bi-stable output.

50. A waveform synthesiser according to claim 49 wherein the number in said store is fixed with respect to the number set in said first store of the variable divider of the clock generator.

51. A waveform synthesiser for producing a waveform which upon integration will approximate a sinusoid of controllable amplitude comprising: a square wave generator producing at least one base square wave, a variable width chopping pulse generator producing a pulse the width of which determines the amplitude of said sinusoid, logic circuitry associated with the square wave generator which sets the chopping pulse location relative to each half cycle of each square wave, means for mixing or gating each square wave with the chopping pulse, a second square wave generator producing a conrol square wave, inverting means corresponding to each phase, and two partial Walsh multiplier means corresponding to each phase, one of which is fed by the chopped square wave and the other of which is fed by its complement, both being fed by the control square wave, or alternatively one of which is fed by the control square wave and the other of which is fed by its complement with both being fed by the chopped square wave, and a tri-state static inverter output stage each phase of which is switched by the output from the corresponding two partial Walsh multiplier means.

52. A waveform synthesiser according to claim 51 wherein said tri-state static inverter output stage includes two individually triggered switches connected in series between the positive and negative supplies, and feedback means across each switch, the output phase waveform being taken from the junction of said switches.

53. A waveform synthesiser according to claim 52 wherein said switches are thyristors and the feedback means are diodes.

54. A waveform synthesiser according to claim 51 wherein the partial Walsh multiplier is an AND gate.

55. A waveform synthesiser according to claim 51 wherein the chopping pulse generator produces a pulse having a width which is determined by the square wave frequency.

56. A waveform synthesiser according to claim 51 wherein said square wave generator is a poly-phase generator.

57. A waveform synthesiser according to claim 56 wherein said square wave generator is a three-phase generator.

58. A waveform synthesiser according to claim 57 wherein the line waveforms are selected as the waveforms to be integrated.

59. A waveform synthesiser according to claim 57 wherein six chopping pulses are generated each base square wave period and the required two pulses per period for each phase are gated to said means for mixing by said logic circuitry.

60. A waveform synthesiser according to claim 51 wherein said means for mixing are EXCLUSIVE-OR gates.

61. A variable frequency AC motor drive including the synthesiser according to claim 51 wherein the or each inverter output can be connected to the or each phase winding of an AC motor.

62. A waveform synthesiser according to claim 51 wherein the control and base square wave generators include a common clock pulse generator which comprises: a master pulse oscillator having a continuously variable frequency, a fixed divider which divides down the pulses from the master oscillator by a factor $K_1$ to produce as an output a first pulse wave which is fed to the base generator, a variable divider which divides down the pulses from the master oscillator by a factor $K_2$ to produce as an output a second pulse wave which is fed to the control generator, the two pulse waves having a fundamental frequency difference equal to $$\frac{K_2 - K_1}{K_1 K_2} \cdot f_o$$

63. A waveform synthesiser according to claim 62 wherein the divisor of the variable divider is ganged with the master oscillator frequency in a manner which ensures that the sum of the frequencies of the first and second pulse waves remains constant with variations in oscillator frequency.

64. A waveform synthesiser according to claim 62 wherein the first and second pulse waves can be interchanged between outputs when $f_o = 0$ Hz.

65. A waveform synthesiser according to claim 51 wherein the control and base square wave generators include a common clock pulse generator which comprises a fixed frequency master pulse oscillator, a fixed divider fed from the master pulse oscillator which produces the base generator clock pulses, a variable divider fed from the master pulse oscillator composed of: a first store which may be set to hold a number representing the desired difference between the base and control square wave frequencies, a first divider fed by the master oscillator with a divisor set by and equal to the number in the first store, a counter fed with the serial output of said first divider to convert said output to parallel form, a second store which is set to hold a number accumulated in said counter in a pre-set time interval, a second divider fed by the master oscillator having a divisor set by and equal to the number in said second store providing as an output the control generator clock pulses.

66. A waveform synthesiser according to claim 65 wherein said counter is reset by pulses from the output of a fixed divider fed from said master oscillator, and said first and second dividers are down counters, the start count being determined by the number in the first and second stores respectively.

67. A waveform synthesiser according to claim 65 wherein the chopping pulse generator comprises: a bi-stable set by the base square wave generator clock pulses, a store into which a number is set which represents the desired chopping pulse width, a down counter the count of which is set by said store once every base generator clock pulse, means for deriving pulses having a frequency which is a multiple of the base generator clock pulses, said counter being fed by these pulses and providing an output at zero count which resets the bi-stable, the chopping pulses being taken from the bi-stable output.

68. A waveform synthesiser according to claim 67 wherein the number in said store is fixed with respect to the number set in said first store of the variable divider of the clock pulse generator.

* * * * *